United States Patent
Hoshikawa et al.

(10) Patent No.: US 10,391,594 B2
(45) Date of Patent: Aug. 27, 2019

(54) NOZZLE STATION INSTALLATION DEVICE

(71) Applicant: FUJI CORPORATION, Chiryu (JP)

(72) Inventors: Kazumi Hoshikawa, Toyohashi (JP); Kenji Shimosaka, Obu (JP)

(73) Assignee: FUJI CORPORATION, Chiryu (JP)

( * ) Notice: Subject to any disclaimer, the term of this patent is extended or adjusted under 35 U.S.C. 154(b) by 297 days.

(21) Appl. No.: 15/329,299

(22) PCT Filed: Aug. 6, 2014

(86) PCT No.: PCT/JP2014/070757
§ 371 (c)(1),
(2) Date: Jan. 26, 2017

(87) PCT Pub. No.: WO2016/021008
PCT Pub. Date: Feb. 11, 2016

(65) Prior Publication Data
US 2017/0216982 A1    Aug. 3, 2017

(51) Int. Cl.
*B23P 21/00* (2006.01)
*H05K 13/04* (2006.01)
*H05K 13/08* (2006.01)

(52) U.S. Cl.
CPC ........ *B23P 21/004* (2013.01); *H05K 13/0408* (2013.01); *H05K 13/0409* (2018.08); *H05K 13/087* (2018.08)

(58) Field of Classification Search
CPC . B23P 21/004; H05K 13/087; H05K 13/0409; H05K 13/0408; H05K 13/04
See application file for complete search history.

(56) References Cited

U.S. PATENT DOCUMENTS

| | | | |
|---|---|---|---|
| 5,894,657 A * | 4/1999 | Kanayama | ........... H05K 13/043 29/740 |
| 6,519,838 B1 * | 2/2003 | Okuda | ............... H05K 13/0409 29/740 |
| 6,735,856 B1 * | 5/2004 | Kitamura | ........... H05K 13/0409 29/833 |

FOREIGN PATENT DOCUMENTS

| | | | | |
|---|---|---|---|---|
| EP | 2 916 637 A1 | | 9/2015 | |
| JP | 2009088570 A | * | 4/2009 | ........... H05K 13/087 |
| WO | 2014/068673 A1 | | 5/2014 | |

OTHER PUBLICATIONS

Machine Translation of Kunio; JP2009088570A; Apr. 2009 (Year: 2009).*

(Continued)

*Primary Examiner* — Ryan J. Walters
(74) *Attorney, Agent, or Firm* — Oblon, McClelland, Maier & Neustadt, L.L.P.

(57) ABSTRACT

A nozzle station installation device capable of installing multiple nozzle stations, which hold multiple suction nozzles that are used in an electronic component mounting machine, in a nozzle cleaning device or the like, is provided. The nozzle station installation device is provided with multiple reference bases, and intermediate bases that are provided to be attachable and detachable on each of the multiple reference bases and on which multiple nozzle stations are capable of being placed, positioning sections which position intermediate bases are provided at a common position on the multiple reference bases, a positioning and fixing device that positions and fixes each of the multiple nozzle stations to be attachable and detachable is provided on each of the multiple intermediate bases, and 2D codes are disposed in a fixed positional relationship with the positioning sections in each of the multiple nozzle stations.

8 Claims, 9 Drawing Sheets

(56) References Cited

OTHER PUBLICATIONS

International Search Report dated Oct. 7, 2014 in PCT/JP2014/070757 filed Aug. 6, 2014.

* cited by examiner

NOZZLE STATION INSTALLATION DEVICE

TECHNICAL FIELD

The present application relates to a nozzle station installation device for installing multiple nozzle stations, which hold multiple suction nozzles that are used in an electronic component mounting machine, in a nozzle cleaning device or the like.

BACKGROUND ART

In an electronic component mounter, a suction nozzle that vacuum holds an electronic component is used in order to mount an electronic component onto a circuit board. In electronic component mounters, it is necessary to appropriately manage suction nozzles in order to increase the mounting accuracy of the electronic components. Therefore, for example, PTL 1 describes a nozzle managing device for cleaning and inspecting suction nozzles that are used in an electronic component mounter.

CITATION LIST

Patent Literature

PTL 1: International Publication No. 2014/068673

SUMMARY

Suction nozzles used in an electronic component mounter vary according to the types and sizes of electronic components, and in order to appropriately manage the suction nozzles, the nozzle stations which hold multiple of the suction nozzles also span many types, and thus, it is desirable to develop a nozzle station installation device that is capable of positioning and fixing multiple different nozzle stations, and additionally, recognizing the types of the nozzle station.

The present disclosure is made in consideration of the above-described needs, and an object thereof is to provide a nozzle station installation device capable of installing multiple nozzle stations that hold multiple suction nozzles.

In order to solve the problem described above, the present disclosure is to provide a nozzle station installation device for installing multiple nozzle stations that hold multiple suction nozzles that are used in an electronic component mounter, including multiple reference bases, and an intermediate base provided on each of the multiple reference bases to be attachable and detachable and on which the multiple nozzle stations are respectively capable of being placed, wherein positioning sections configured to position the intermediate base are provided on each of the multiple reference bases at common positions, wherein a positioning and fixing device that positions and fixes the multiple nozzle stations to be attachable and detachable is provided on each of the multiple intermediate bases, and wherein a 2D code is disposed on each of the multiple nozzle stations in a fixed positional relationship with the positioning sections.

According to the present disclosure described above, for example, it is possible to position and fix the multiple nozzle stations, via the intermediate bases, on the multiple reference bases that are fixed onto the nozzle station support section of the nozzle cleaning device. Furthermore, it is possible to recognize the types of nozzle station based on the 2D codes that are respectively disposed in a fixed positional relationship with the positioning sections.

DESCRIPTION OF EMBODIMENTS

Figure 1:
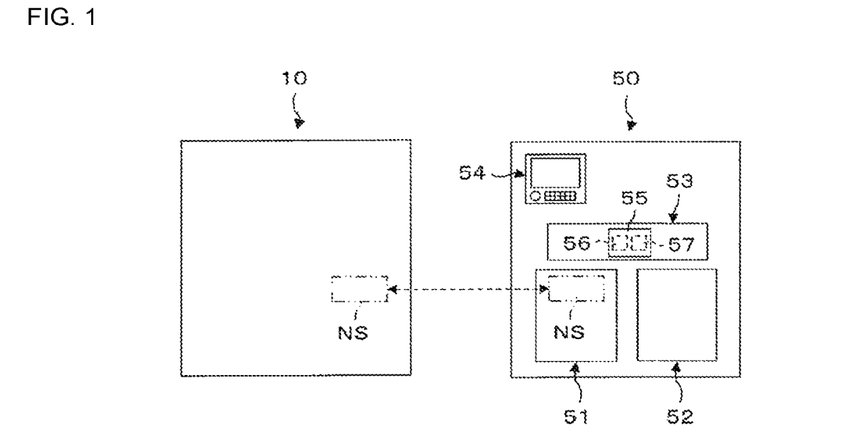
FIG. 1 is a view illustrating an embodiment of the present disclosure, and illustrates an outline of a nozzle cleaning device that cleans a suction nozzle that is used in an electronic component mounting machine.

Hereinafter, description will be given of an embodiment of the present disclosure with reference to the drawings. FIG. 1 illustrates nozzle cleaning device 50 for cleaning suction nozzles N (refer to FIG. 2) that are used in electronic component mounting machine 10. Nozzle cleaning device 50 is provided with nozzle station support section 51 that supports nozzle station NS that holds multiple suction nozzles N, nozzle cleaning section 52 that cleans suction nozzles N, nozzle transfer section 53 that transfers suction nozzles N that are held by nozzle station NS that is supported by nozzle station support section 51 to nozzle cleaning section 52, and control section 54 that controls nozzle cleaning device 50. It is possible to provide an inspection device that inspects the cleaned suction nozzles N in nozzle cleaning device 50.

Nozzle transfer section 53 is provided with transfer head 55 that is capable of moving in three directions, and transfer head 55 is provided with camera 56 that images a 2D code (described later) attached to nozzle station NS, holding chuck 57 that holds suction nozzles N that are held by nozzle station NS one at a time, and the like.

Figure 2:
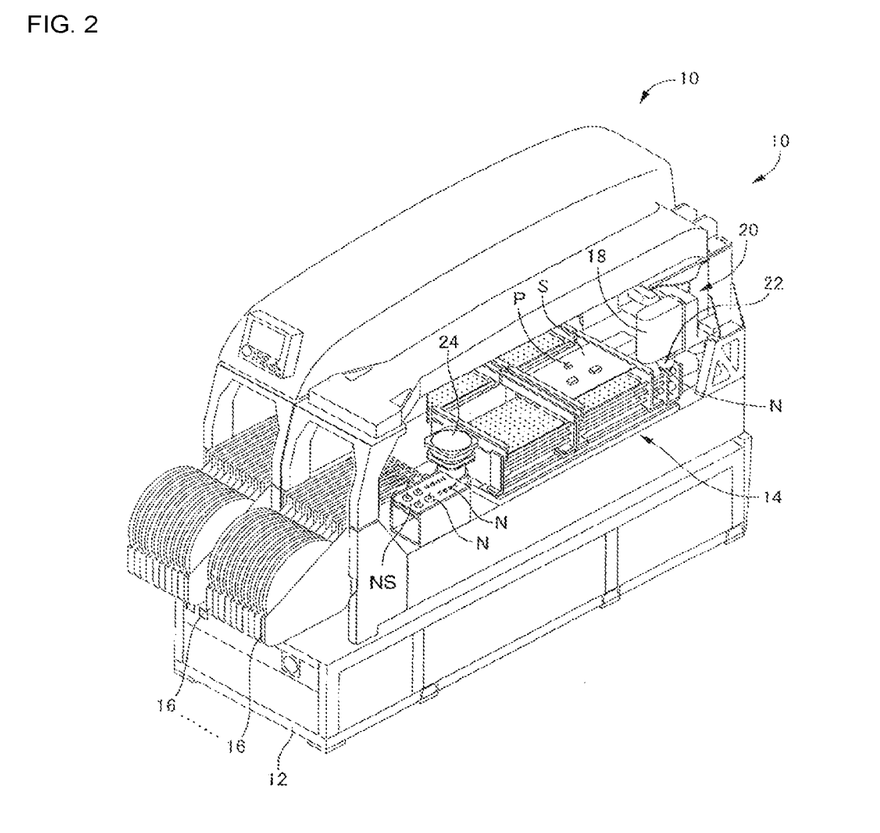
FIG. 2 is a perspective view illustrating an electronic component mounting machine that mounts an electronic component onto a printed circuit board.

FIG. 2 illustrates an example of electronic component mounting machine 10, and illustrates an example in which two of the electronic component mounting machines 10 that have the same structure are provided lined up. Electronic component mounting machine 10 is configured to include conveyor-type board conveyance device 14 that conveys printed circuit board S and positions and fixes the printed circuit board S at a predetermined position, multiple feeder-type component supply devices 16 that supply electronic components P to component supply positions, mounting head 18 for mounting the electronic components P supplied to the component supply positions by component supply devices 16 onto printed circuit board S, and head moving device 20 that causes mounting head 18 to move between component supply device 16 and printed circuit board S.

Mounting head 18 supports nozzle shaft 22 such that nozzle shaft 22 is capable of being lifted, lowered, and rotated, and suction nozzle N is attached to the bottom end portion of nozzle shaft 22 so as to be attachable and detachable. Mounting head 18 is configured from an indexable rotary head, for example, and the multiple suction nozzles N are attached to the multiple nozzle shafts 22 that are supported by the rotary head.

Electronic component P adhered to suction nozzle N is imaged from below by component camera 24 that is installed on fixing stand 12, and the electronic component P is mounted at a defined position on the printed circuit board S in a defined posture based on image data obtained through the imaging. Although not depicted, a board camera that images board marks or the like formed on the printed circuit board S from above is attached to mounting head 18.

In electronic component mounting machine 10, multiple suction nozzles N that have different sizes and shapes are used, and a nozzle station NS is provided for each type of suction nozzles N. Nozzle station NS is installed beside component supply devices 16 on fixing stand 12 to be attachable and detachable. Nozzle station NS functions as a nozzle holder that holds the multiple suction nozzles N to be attachable and detachable, and the multiple suction nozzles N that are held by nozzle station NS are automatically mounted to nozzle shaft 22 of mounting head 18 using a well-known method.

Figure 3:
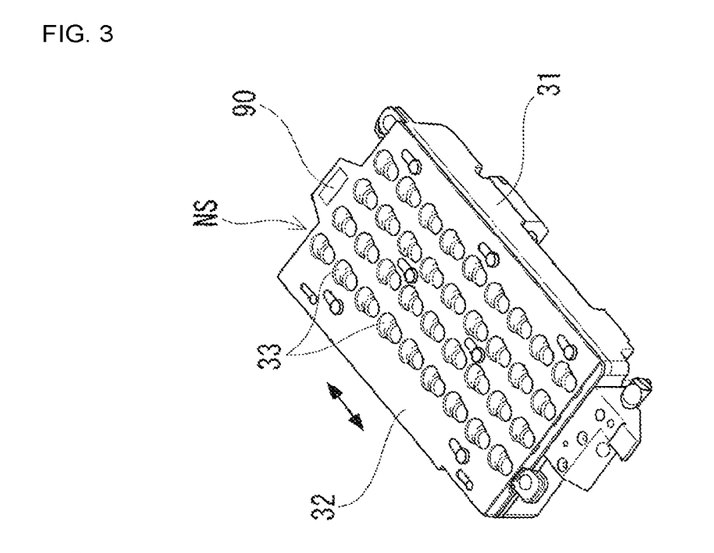
FIG. 3 is a perspective view illustrating an example of a nozzle station that holds multiple suction nozzles.

FIG. 3 illustrates an example of nozzle station NS. Nozzle station NS is substantially a parallelepiped shape, and includes multiple holding holes 33 that hold suction nozzle N to be attachable and detachable in a posture in which nozzle section Na (refer to FIG. 4) faces downward. In FIG. 3, suction nozzles N that are held in holding holes 33 are omitted.

Figure 4:
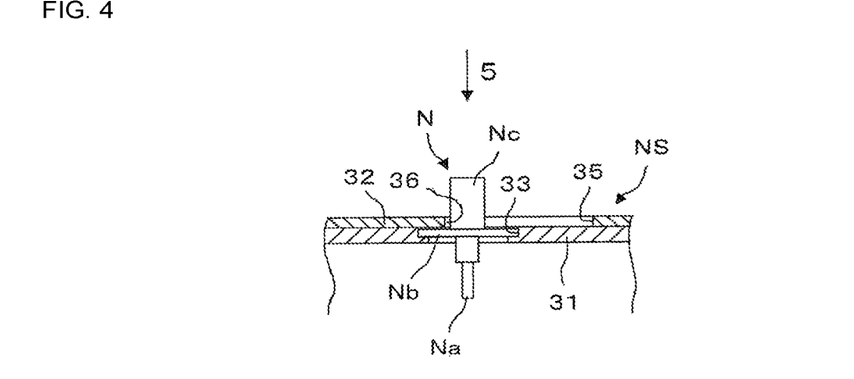
FIG. 4 is a sectional view of the nozzle station holding a suction nozzle.
Figure 5:
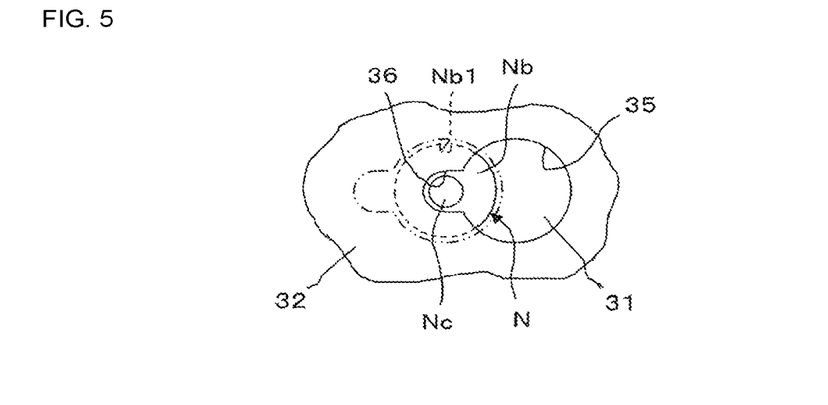
FIG. 5 is a top view of the nozzle station as viewed from the direction of arrow 5 of FIG. 4.

As illustrated in FIGS. 4 and 5, nozzle station NS includes base plate 31, and cover plate 32 that covers the upper surface of base plate 31. Cover plate 32 is capable of sliding a predetermined amount in the direction of the arrows of FIG. 3 in relation to base plate 31. The multiple holding holes 33 that hold suction nozzles N are provided in base plate 31 to with a fixed interval in the vertical direction and the horizontal direction. Holding holes 33 are stepped holes, and flange section Nb of suction nozzle N is placed on the step surface of the stepped hole. Notch Nb1 is formed in the outer circumference of flange section Nb, and a pin (not illustrated) that engages with notch Nb1 is provided on the step surface of holding hole 33. Due to the engagement of notch Nb1 and the pin, suction nozzle N is placed at a defined angle, and the rotation of suction nozzle N is prevented.

Meanwhile, circular escape hole 35 is formed in cover plate 32 corresponding to holding hole 33, and slot portion 36 is formed in a portion of the inner circumference of escape hole 35. Escape hole 35 is formed to approximately the same inner diameter as holding hole 33, and the width of slot portion 36 is slightly greater than the outer diameter of shaft portion Nc of suction nozzle N that is inserted into an insertion hole of nozzle shaft 22.

By cover plate 32 sliding in relation to base plate 31, there is a change between a state in which holding holes 33 and escape holes 35 match, and a state in which holding holes 33 are blocked by slot portion 36. Cover plate 32 is biased in a direction that blocks holding holes 33 by a spring that is not illustrated, and ordinarily, suction nozzles N do not protrude out from nozzle station NS. When removing suction nozzles N, cover plate 32 acts against the spring due to an actuating device, which is not illustrated.

In the embodiment, nozzle station NS includes horizontal nozzle station NS1 and vertical nozzle station NS2 (refer to FIG. 8) that hold multiple comparatively small or medium suction nozzles N, and large-nozzle station NS3 (refer to FIG. 9) that holds multiple comparatively large suction nozzles NL. Multiple horizontal nozzle stations NS1 are prepared according to the multiple types of suction nozzles N, and are installed horizontally oriented in electronic component mounting machine 10. Similarly, multiple vertical nozzle stations NS2 are prepared according to the multiple types of suction nozzles N, and are installed vertically oriented in electronic component mounting machine 10.

Nozzle station NS that holds suction nozzles N that are used in electronic component mounting machine 10 is carried to nozzle cleaning device 50 periodically or alternatively when the setup is changed, and suction nozzles N are cleaned in nozzle cleaning section 52 one at a time. It is possible to use the nozzle cleaning device described in International Publication No. 2014/068673, for example, for nozzle cleaning device 50. Nozzle cleaning device 50 that cleans suction nozzle N not only applies to suction nozzles N that are used in the single electronic component mounting machine 10 illustrated in FIG. 2, but also applies to suction nozzles that are used in different electronic component mounting machines.

Figure 6:
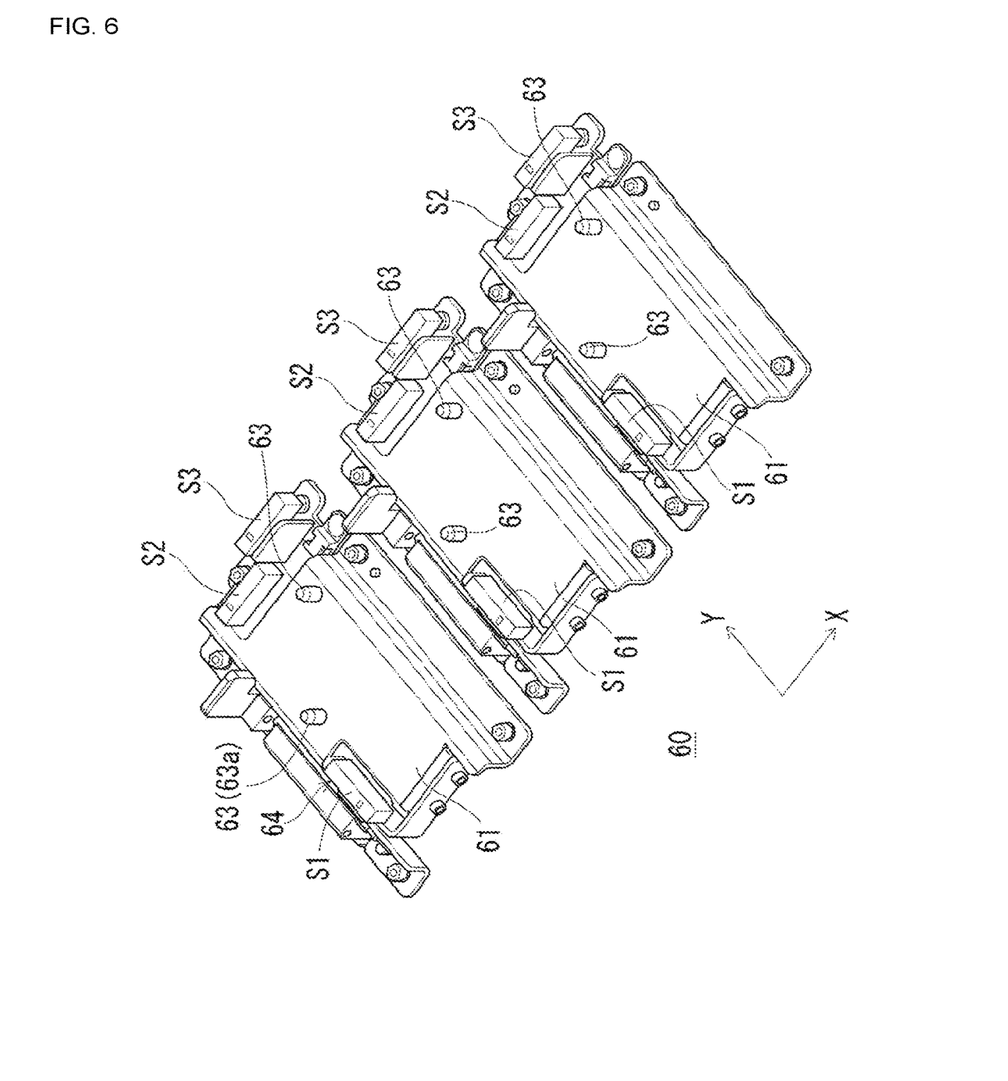
FIG. 6 is a diagram illustrating a reference base that is installed on a nozzle station support section of the nozzle cleaning device.

As illustrated in FIG. 6, the multiple rectangular reference bases 61 for installing horizontal and vertical nozzle stations NS1 and NS2 via an intermediate base 62, which is described later, are fixed onto support base 60 of nozzle station support section 51 of nozzle cleaning device 50. In the embodiment, three reference bases 61 are installed with a fixed interval in the X-direction.

The multiple reference bases 61 have the same configuration as each other, a pair of positioning pins 63 is provided to protrude upward in a common position on the upper surface of each of the reference bases 61, and each of the positioning pins 63 serves as a positioning section that positions intermediate base 62. Seating detection sensor 64 formed of three switches (limit switches) S1 to S3 that have intervals is installed on each of the reference bases 61 in a corresponding common position.

Figure 7:
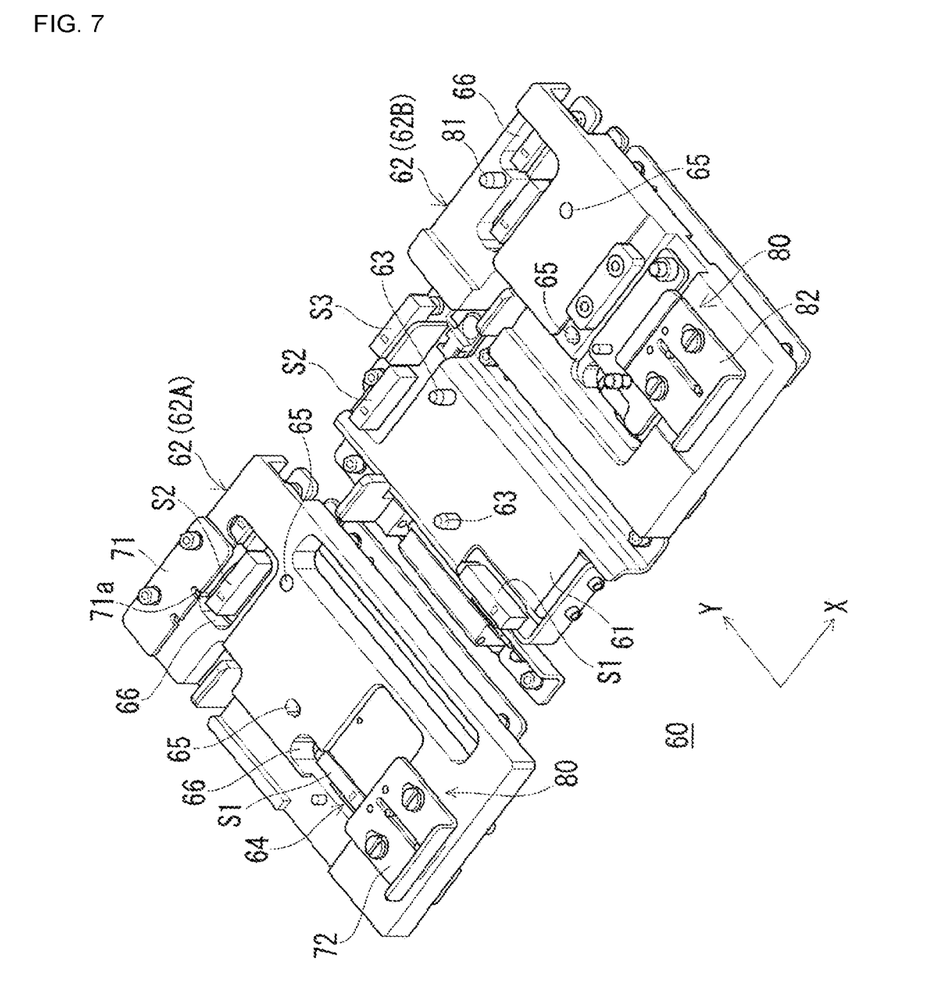
FIG. 7 is a view illustrating a state in which intermediate bases are placed on the reference bases.

As illustrated in FIG. 7, intermediate base 62 is formed in a flat rectangular shape, and is placed on the upper surface of each of the reference bases 61 to be attachable and detachable. A pair of positioning holes 65, which engage with the pair of positioning pins 63 provided to protrude on the upper surface of reference base 61, are formed in intermediate base 62. Space portion 66 that houses three switches, S1 to S3, of seating detection sensor 64 that is installed on reference base 61 are hollowed out from intermediate base 62, and an actuator of each of the switches S1 to S3 is exposed at the top of intermediate base 62.

At least two types of intermediate base 62 are prepared corresponding to the types of nozzle stations, horizontal nozzle station NS1 and vertical nozzle station NS2. In other words, a horizontal intermediate base 62A on which the horizontal nozzle station NS1 is placed, and a vertical intermediate base 62B on which the vertical nozzle station NS2 is placed are provided.

Figure 10:
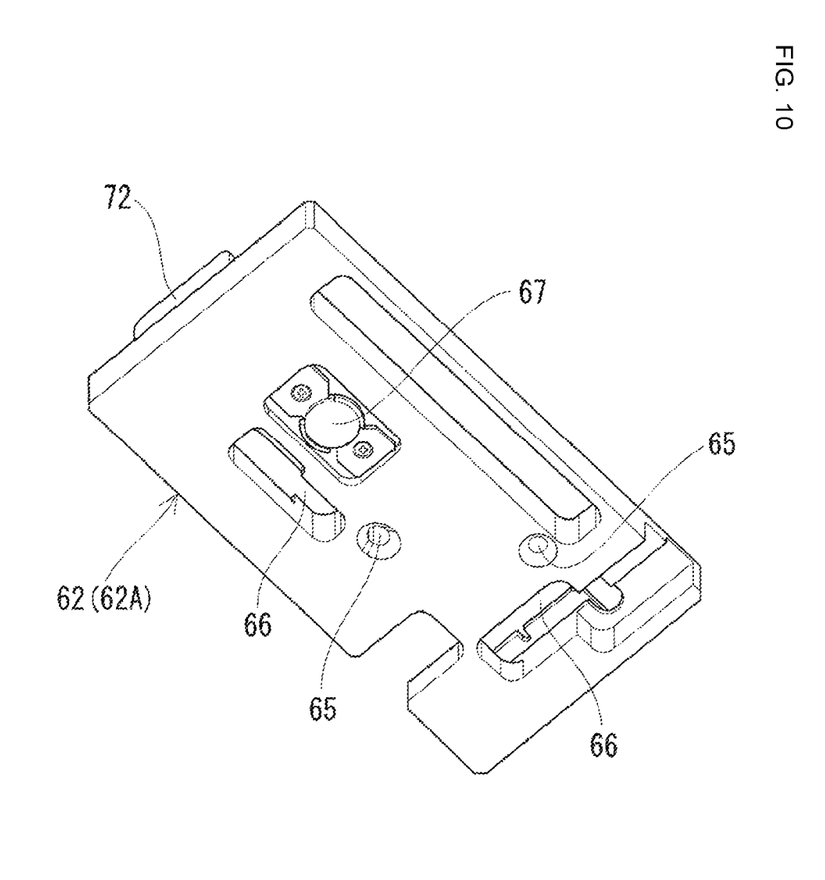
FIG. 10 is a view illustrating the lower surface of the intermediate base.

Intermediate base 62 (horizontal and vertical intermediate bases 62A and 62B) are configured using plastic, for example, and, as illustrated in FIG. 10, magnet 67 is attached to the lower surface of each of the intermediate bases 62. Intermediate base 62 is attached onto the reference base 61, which is made of metal, due to magnet 67. Accordingly, even if vibration or the like is generated by nozzle cleaning device 50 together with the movement of transfer head 55 of nozzle transfer section 53 of nozzle cleaning device 50, and even if there is wobbling between positioning pins 63 on reference base 61 and positioning holes 65 of intermediate base 62, intermediate base 62 does not move in the horizontal direction or in the vertical direction in relation to reference base 61.

Figure 8:
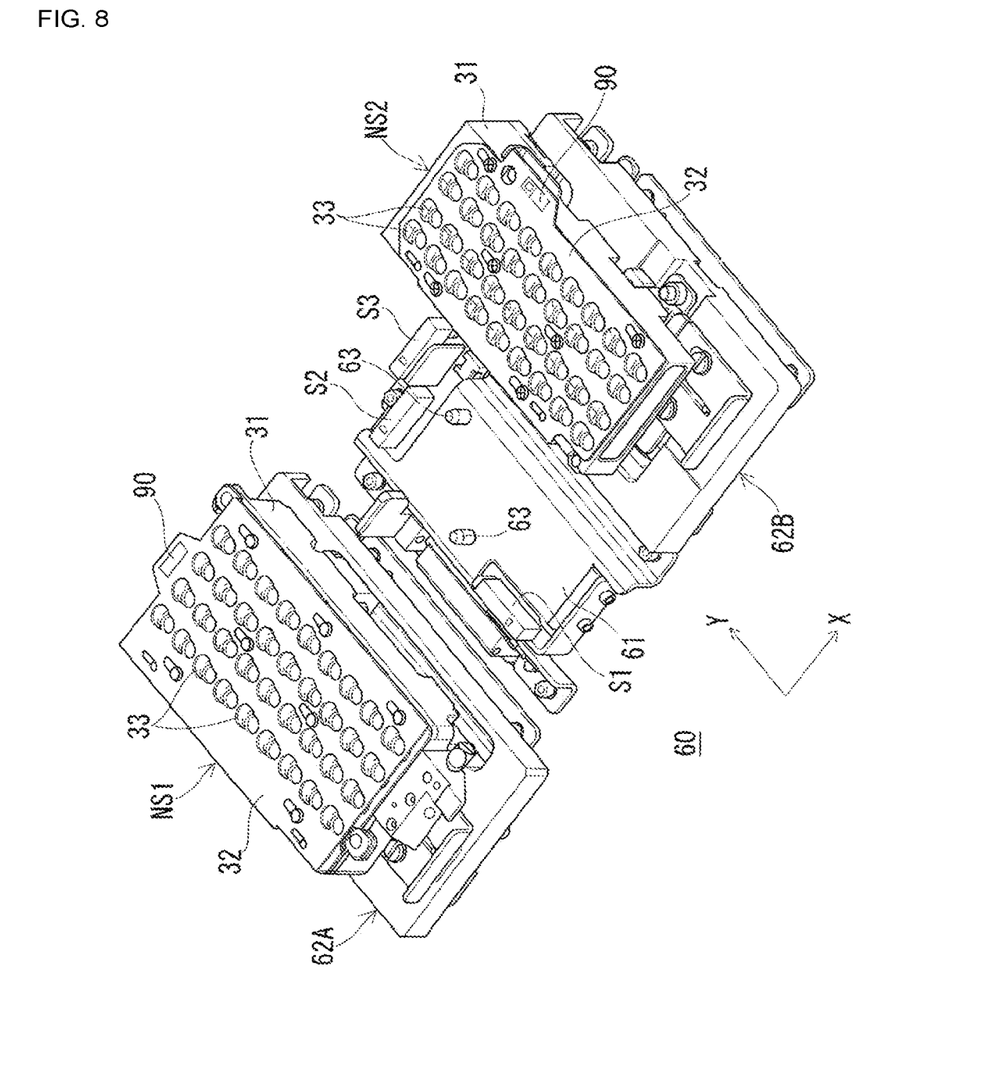
FIG. 8 is a view illustrating a state in which nozzle stations are placed on the intermediate bases.

As illustrated in FIG. 8, horizontal nozzle station NS1 is positioned and fixed on horizontal intermediate base 62A to be attachable and detachable. In order to position and fix horizontal nozzle station NS1, as illustrated in FIG. 7, engaging fitting 71 and pushing fitting 72 are disposed on horizontal intermediate base 62A separated in the Y-direction, which is orthogonal to the X-direction. Engaging fitting 71 is fixed on horizontal intermediate base 62A so as to form a minute gap between engaging fitting 71 and the upper surface of horizontal intermediate base 62A. Pushing fitting 72 is supported to be capable of moving in the Y-direction relative to horizontal intermediate base 62A, and is always biased in a direction approaching engaging fitting 71 due to a spring, which is not illustrated. Engaging groove 71a is formed in engaging fitting 71 on the side which faces pushing fitting 72.

Figure 12:
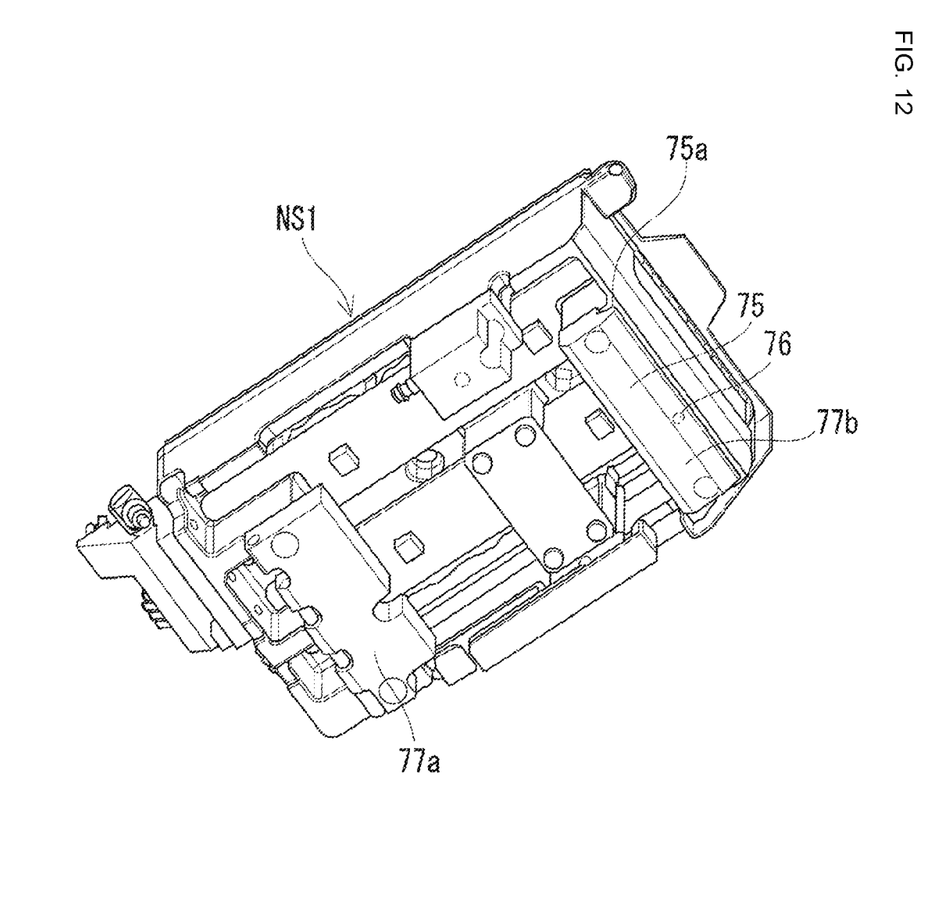
FIG. 12 is a view illustrating the lower surface of the nozzle station.

Meanwhile, as illustrated in FIG. 12, engaging block 75 that includes inclined surface 75a capable of engaging with the lower surface of engaging fitting 71 is provided on the lower surface of one end of horizontal nozzle station NS1. Engaging pin 76 that engages with engaging groove 71a of engaging fitting 71 is provided on engaging block 75.

In a case in which horizontal nozzle station NS1 is placed on horizontal intermediate base 62A, horizontal nozzle station NS1 is placed on horizontal intermediate base 62A between engaging fitting 71 and pushing fitting 72 in a state in which pushing fitting 72 is caused to be separated by engaging fitting 71 against the biasing force of the spring that is not illustrated. In this state, when the restriction of pushing fitting 72 is released, pushing fitting 72 is caused to proceed by the biasing force of the spring, which is not illustrated, and horizontal nozzle station NS1 is pushed in the Y-direction toward engaging fitting 71.

Accordingly, engaging pin 76 provided on horizontal nozzle station NS1 is engaged with engaging groove 71a of engaging fitting 71 on horizontal intermediate base 62A, and inclined surface 75a of engaging block 75 is engaged with the lower surface of engaging fitting 71. In this case, horizontal nozzle station NS1 is pushed downward by the action of inclined surface 75a so as to come into close contact with the upper surface of horizontal intermediate base 62A. As a result, the horizontal nozzle station NS1 is positioned in the X-direction and the Y-direction and fixed on horizontal intermediate base 62A.

Positioning and fixing device 80 that positions and fixes nozzle station NS to be attachable and detachable is configured on intermediate base 62 by engaging fitting 71 in which engaging groove 71a described above is formed, pushing fitting 72, engaging block 75 on which inclined surface 75a is formed, engaging pin 76, and the like. In the embodiment, the configuration of positioning and fixing device 80 that positions and fixes horizontal nozzle station NS1 on horizontal intermediate base 62A and of positioning and fixing device 80 that positions and fixes vertical nozzle station NS2 on vertical intermediate base 62B are different from each other; however, the same configuration may be adopted.

As illustrated in FIG. 12, two actuating sections, 77a and 77b, that push two switches (for example, the first and the second switches S1 and S2) of three switches S1 to S3 of seating detection sensor 64 are provided on the lower surface of horizontal nozzle station NS1. When the first and the second switches S1 and S2 are both turned on at the same time by the two actuating sections 77a and 77b that are formed on horizontal nozzle station NS1, the fact that nozzle station NS1 is seated on intermediate base 62A in the correct posture is detected. At the same time, it is possible to recognize that nozzle station NS seated on intermediate base 62 is horizontal nozzle station NS1 based on the operation state of seating detection sensor 64.

Vertical nozzle station NS2 is positioned and fixed on vertical intermediate base 62B to be attachable and detachable. In order to position and fix vertical nozzle station NS2, as illustrated in FIG. 7, an engaging pin 81 and a pushing fitting 82 are disposed on vertical intermediate base 62B to be separated in the Y-direction. Pushing fitting 82 is supported to be capable of moving in the Y-direction relative to vertical intermediate base 62B, and is always biased in a direction approaching engaging pin 81 due to a spring, which is not illustrated.

Figure 13:
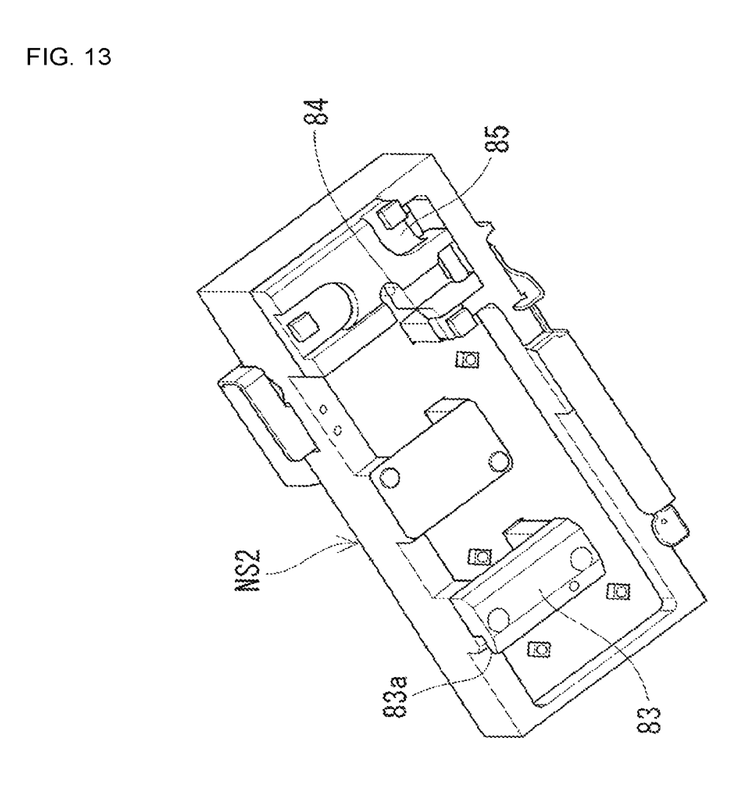
FIG. 13 is a diagram illustrating the lower surface of a nozzle station different from that of FIG. 12.

As illustrated in FIG. 13, engaging block 83 that includes inclined surface 83a capable of engaging with the lower surface of pushing fitting 82 is provided on the lower surface of vertical nozzle station NS2. Engaging long groove 84 that is capable of engaging with engaging pin 81 of vertical intermediate base 62B is formed on the bottom end of vertical nozzle station NS2.

In a case in which vertical nozzle station NS2 is placed on vertical intermediate base 62B, vertical nozzle station NS2 is placed so as to engage engaging long groove 84 with engaging pin 81 on vertical intermediate base 62B in a state in which pushing fitting 82 is caused to separate by engaging pin 81, against the biasing force of a spring, which is not illustrated. In this state, when the restriction of pushing fitting 82 is released, pushing fitting 82 is caused to proceed by the biasing force of the spring, which is not illustrated, and vertical nozzle station NS2 is pushed in the Y-direction.

Accordingly, engaging pin 81 is engaged with the groove end of engaging long groove 84, and inclined surface 83a of engaging block 83 is engaged with the lower surface of pushing fitting 82. At this time, due to the action of inclined surface 83a, vertical nozzle station NS2 is pushed downward to adhere closely to the upper surface of vertical intermediate base 62B. As a result, vertical nozzle station NS2 is positioned in the X-direction and the Y-direction and fixed on vertical intermediate base 62B.

As illustrated in FIG. 13, one actuating section 85 which pushes one switch (for example, the second switch S2) of the seating detection sensor 64 is provided on the lower surface of vertical nozzle station NS2. Another actuating section (not illustrated) that pushes another single switch (for example, the third switch S3) of seating detection sensor 64 is provided on the lower surface of vertical intermediate base 62B. When the first and the third switches, S1 and S3, are both turned on at the same time by the three actuating sections 85 (one is not illustrated) that are formed on vertical nozzle station NS2 and vertical intermediate base 62B, the fact that nozzle station NS2 is seated on intermediate base 62B in the correct posture is detected. At the same time, it is possible to recognize that nozzle station NS2 which is seated on intermediate base 62B is horizontal nozzle station NS2 based on the operation state of seating detection sensor 64. Two actuating sections may be provided on vertical nozzle station NS2 in the same manner as horizontal nozzle station NS1.

Figure 9:
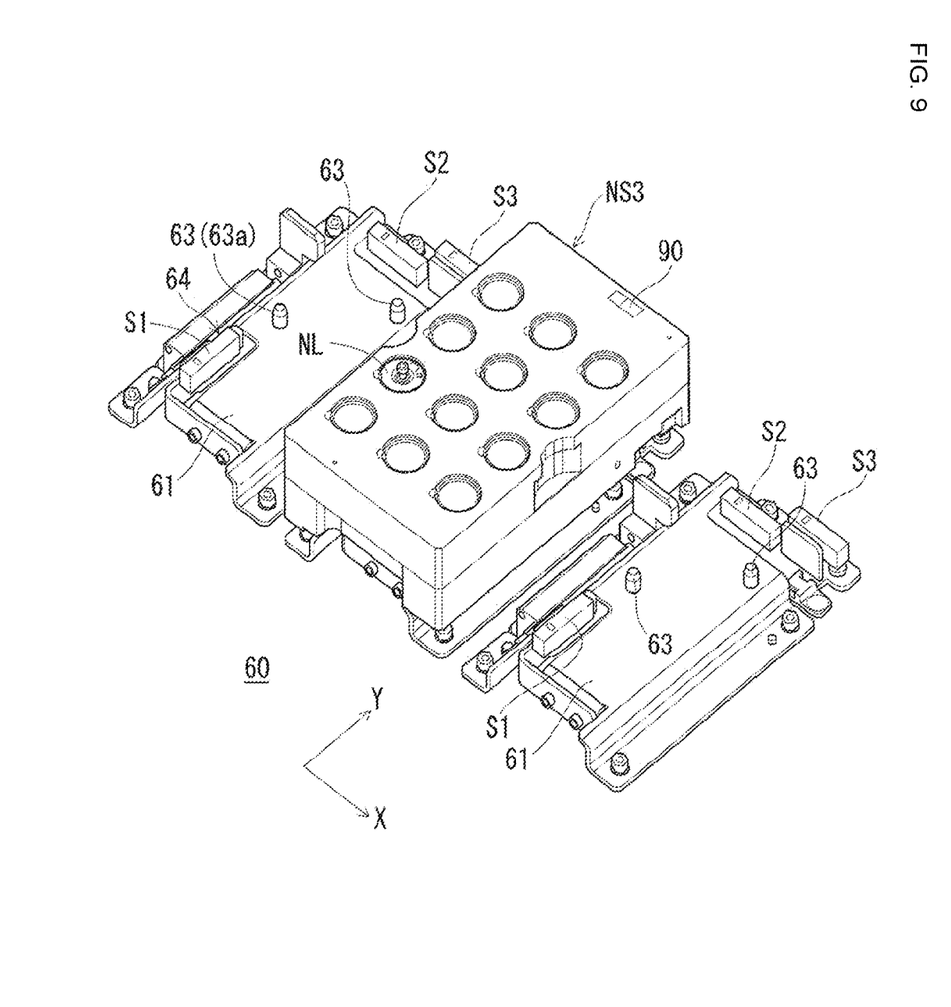
FIG. 9 is a view illustrating a state in which a large-nozzle station is placed directly on the reference base.

As illustrated in FIG. 9, large-nozzle station NS3 that is capable of holding multiple large suction nozzles NL is capable of being placed directly on reference base 61 without interposing intermediate base 62. Although not illustrated, positioning holes which are capable of engaging with the pair of positioning pins 63 on reference base 61 are formed in large-nozzle station NS3, and an actuating section that actuates seating detection sensor 64 on reference base 61 is formed on large-nozzle station NS3.

Large-nozzle station NS3 in the embodiment is not installed in electronic component mounting machine 10, and is prepared for cleaning large suction nozzles NL. Accordingly, large suction nozzles NL are mounted to large-nozzle station NS3 that is positioned and fixed on reference base 61 one at a time by an operator.

2D code 90 that serves as an identifier for recognizing unique information of nozzle station NS is bonded to the upper surface of each of the nozzle stations NS1, NS2, and NS3. 2D code 90 is disposed in a fixed positional relationship with each of the positioning pins 63 (hereinafter, referred to as reference positioning pins 63a (refer to FIG. 6 and the like)) that are on each of the reference bases 61.

Here, the positions of the 2D codes 90 that are bonded to horizontal nozzle station NS1, vertical nozzle station NS2, and large-nozzle station NS3 are different from each other, and the position of camera 56 that images the 2D codes 90 is controlled based on the recognition of nozzle station NS by seating detection sensor 64. In a case in which horizontal nozzle station NS1 is placed on each of the multiple reference bases 61, the positions of the 2D codes 90 are the same.

In other words, since each of the nozzle stations NS1 to NS3 is positioned and fixed on intermediate base 62, which is positioned and fixed on reference base 61, or is positioned and fixed directly on reference base 61, the 2D codes 90 on the nozzle stations NS1 to NS3 that are placed on intermediate bases 62 are disposed in a fixed positional relationship relative to the reference positioning pins 63a.

For example, the 2D code 90 that is bonded to horizontal nozzle station NS1 is disposed in a position offset in relation to reference positioning pin 63a in the X-direction by distance X1 and in the Y-direction by distance Y1, the 2D code 90 that is bonded to vertical nozzle station NS2 is disposed in a position offset in relation to reference positioning pin 63a in the X-direction by distance X2 and in the Y-direction by distance Y2, and the 2D code 90 that is bonded to large-nozzle station NS3 is disposed in a position offset in relation to reference positioning pin 63a in the X-direction by distance X3 and in the Y-direction by distance Y3.

Figure 11:
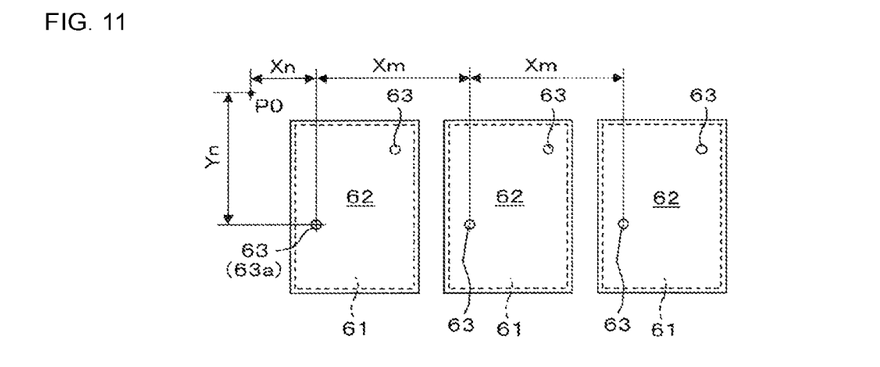
FIG. 11 is a view illustrating the positional relationship of positioning pins to a mechanical origin point of the nozzle cleaning device.

Here, as illustrated in FIG. 11, since reference positioning pin 63a is provided in a position separated in relation to a mechanical origin point P0 (X0, Y0) of nozzle cleaning device 50 in the X-direction by distance Xn, and in the Y-direction by distance Yn, the 2D code 90 of horizontal nozzle station NS1 is positioned at a predetermined coordinates position (Xn1, Yn1, where Xn1=Xn+X1, and Yn1=Yn+Y1) in relation to the mechanical origin point. Similarly, the 2D code 90 of vertical nozzle station NS2 is positioned at a predetermined coordinates position (Xn2, Yn2, where Xn2=Xn+X2, and Yn2=Yn+Y2) in relation to the mechanical origin point.

Since positioning pins 63 on reference bases 61 that are adjacent to each other are separated by fixed distance Xm in the X-direction, in a case in which, hypothetically, the horizontal nozzle stations NS1 are correspondingly placed on the multiple reference bases 61 via intermediate bases 62, the 2D codes 90 on the nozzle stations NS1 are also disposed in positions which are separated by fixed distance Xm in the X-direction.

Since the thicknesses of nozzle stations NS1 and NS2 are different according to the size and the like of the suction nozzles N to be held, the heights of intermediate bases 62A and 62B are adjusted according to the thicknesses of nozzle stations NS1 and NS2, and the height positions of 2D codes 90 are set to be a fixed height from the upper surface of support base 60. Accordingly, when imaging the 2D code 90 using camera 56 of nozzle transfer section 53, it is possible to accurately image the 2D code 90 using camera 56, which is positioned at a fixed height position.

By enabling large-nozzle station NS3 to be directly positioned on reference base 61 using positioning pins 63 without interposing intermediate base 62, even in a case in which large suction nozzles NL are held, it is possible to suppress the height of nozzle station NS3 on which the 2D code 90 is disposed.

Figure 14:
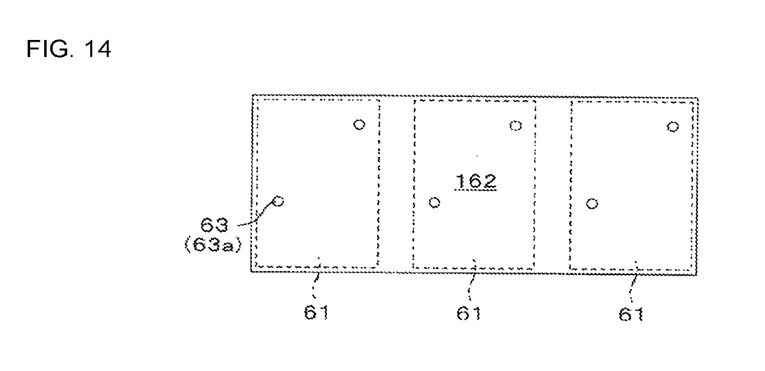
FIG. 14 is a diagram illustrating a state in which an intermediate base is placed across the multiple reference bases.

FIG. 14 illustrates large intermediate base 162 that is placed on reference base 61 across the multiple (two or three) reference bases 61. Accordingly, it is possible to place a nozzle station of a size several times that of reference base 61 on intermediate base 162. In this case, by forming two positioning holes (not illustrated) that are capable of engaging with any two of the positioning pins 63 on the three reference bases 61 in large intermediate base 162, it is possible to perform the positioning in a predetermined position. It is possible to position and fix the nozzle station (not illustrated) on large intermediate base 162 using the positioning and fixing device 80 that is the same as that illustrated in FIG. 7.

Next, description will be given of cleaning operation of suction nozzle N according to the embodiment described above. In order to clean suction nozzle N that is used in electronic component mounting machine 10, nozzle station NS that holds the multiple suction nozzles N is removed from electronic component mounting machine 10 by an operator, and is placed on reference base 61 of nozzle cleaning device 50 via intermediate base 62. Hereinafter, description will be given of an example in which horizontal nozzle station NS1 is placed on reference base 61.

In order to place horizontal nozzle station NS1, horizontal intermediate base 62A that is adapted to horizontal nozzle station NS1 is positioned on reference base 61 by the pair of positioning pins 63, and is fixed in close adherence to the upper surface of reference base 61 by magnet 67.

Next, horizontal nozzle station NS1 is positioned and fixed on horizontal intermediate base 62A by positioning and fixing device 80 that includes engaging fitting 71 and pushing fitting 72. When horizontal nozzle station NS1 is placed on horizontal intermediate base 62A, the two switches (the first and the second switch) S1 and S2 of seating detection sensor 64 are operated by the two actuating sections 77a and 77b provided on horizontal nozzle station NS1, an operation signal of seating detection sensor 64 is transmitted to control section 54, and in control section 54, the fact that horizontal nozzle station NS1 is seated on horizontal intermediate base 62A in the correct posture is recognized. It is possible to acquire the positional information of the 2D code 90 that is bonded to horizontal nozzle station NS1 based on the recognition.

When the fact that horizontal nozzle station NS1 is seated is detected based on the operation signal of seating detection sensor 64, transfer head 55 of nozzle transfer section 53 of nozzle cleaning device 50 is moved, and camera 56 that is attached to transfer head 55 is positioned in a position above the 2D code 90 of horizontal nozzle station NS1. That is, since the 2D code 90 of horizontal nozzle station NS1 is disposed in a fixed positional relationship with reference positioning pin 63a of reference base 61, by moving transfer head 55 by a predetermined amount in the X and Y-directions in relation to the mechanical origin point (X0, Y0) of nozzle cleaning device 50, it is possible to position camera 56 that is attached to transfer head 55 at a position above the 2D code 90 of horizontal nozzle station NS1.

In this state, the 2D code 90 of horizontal nozzle station NS1 is imaged by camera 56, and captured image data is transmitted to control section 54. Control section 54 performs image processing on the transmitted captured image data and specifies the type of the horizontal nozzle station NS1 with reference to a database that is stored in control section 54. As a result, the type, arrangement, and the like, of the suction nozzles N that are held in horizontal nozzle station NS1 are specified.

In a case in which the suction nozzles N that are held by horizontal nozzle station NS1 are cleaned, transfer head 55 of nozzle transfer section 53 of nozzle cleaning device 50 is moved, and holding chuck 57 is positioned at a position corresponding to the first holding hole 33 of nozzle station NS1. In this state, holding chuck 57 is lowered, and the suction nozzle N that is held in the first holding hole 33 is held.

At this time, intermediate base 62A is positioned and fixed on reference base 61 by positioning pin 63 and magnet 67, and nozzle station NS1 is positioned and fixed on intermediate base 62A by positioning and fixing device 80, and thus, it is possible to hold the suction nozzle N using holding chuck 57 without errors, and to transfer the suction nozzle N to nozzle cleaning section 52.

Before the suction nozzle N is held by holding chuck 57, cover plate 32 of nozzle station NS1 is operated against the spring by an actuating device (not illustrated), and the removal of the suction nozzle N from nozzle station NS1 becomes possible.

Subsequently, transfer head 55 is moved, the suction nozzle N that is held by holding chuck 57 is transferred to nozzle cleaning section 52 of nozzle cleaning device 50, and the cleaning of the suction nozzle N is performed in nozzle cleaning section 52. After the cleaning, the suction nozzle N is returned to the original holding hole 33 of the horizontal nozzle station NS1 by holding chuck 57.

Next, transfer head 55 is moved by a predetermined amount in the X-direction or the Y-direction according to the type of horizontal nozzle station NS1, and holding chuck 57 is positioned at a position corresponding to the second holding hole 33 of horizontal type nozzle station NS1. Thereafter, in the same manner as described above, the suction nozzles N are held one at a time, are transferred to nozzle cleaning section 52, and the suction nozzles N are cleaned.

Even in a case in which vertical nozzle station NS2 or large-nozzle station NS3 is placed on reference base 61, in the same manner as described above, based on the reading of the 2D code 90, the suction nozzles N and NL which are held by the nozzle stations NS2 and NS3 are held by holding chuck 57, are transferred to nozzle cleaning section 52, and are sequentially cleaned.

The nozzle station installation device according to the embodiment described above is provided with multiple reference bases 61 and intermediate bases 62 that are provided to be attachable and detachable on each of the multiple reference bases 61 and on which multiple nozzle stations NS may be placed, positioning pins (positioning sections) 63 that position intermediate bases 62 are provided at a common position on the multiple reference bases 61, the positioning and fixing device 80 that positions and fixes the multiple nozzle stations NS to be attachable and detachable is provided on each of the multiple intermediate bases 62, and the 2D codes 90 are disposed in a fixed positional relationship with positioning pins 63 in each of the multiple nozzle stations NS.

Accordingly, for example, it is possible to position and fix the multiple nozzle stations NS via intermediate base 62 on the multiple reference bases 61 that are fixed on nozzle station support section 51 of nozzle cleaning device 50. Moreover, it is possible to recognize the type of the nozzle station NS based on the 2D code 90 disposed in a fixed positional relationship with positioning pins 63, respectively.

In the embodiment described above, seating detection sensor 64 that detects the seating of nozzle stations NS1 and NS2 that are placed on the intermediate base is provided on each of the multiple reference bases 61 at the common position, seating detection sensor 64 is formed form the multiple switches S1 to S3, and it is possible to recognize the nozzle stations NS1 and NS2 that are placed on intermediate base 62 based on the operation state of the multiple switches S1 to S3.

Accordingly, seating detection sensor 64 is capable of recognizing the nozzle stations NS1 and NS2 that are placed on intermediate base 62, and based on this, the positional information of the 2D code 90 may be acquired, and it becomes possible to image the 2D code 90 using camera 56.

In the embodiment described above, the 2D code 90 is disposed at the same position on the multiple nozzle stations NS, or at positions which are different from each other. Accordingly, it is possible to dispose the position of the 2D code 90 according to the nozzle station NS.

In the embodiment described above, at least one of the large-nozzle stations NS3 that holds large suction nozzles NL is provided separately from nozzle stations NS1 and NS2, it is possible to directly position the large-nozzle station NS3 on reference base 61 using positioning pins 63 without interposing intermediate base 62, and the 2D code 90 is disposed in a fixed positional relationship with positioning pins 63 on large-nozzle station NS3.

Accordingly, even in a case in which it is possible to directly position large-nozzle station NS3 on reference base 61 using positioning pins 63 without interposing intermediate base 62, and the large suction nozzles NL are held, it is possible to suppress the height of the nozzle station NS3 on which the 2D code 90 is disposed.

In the embodiment described above, intermediate base 62 is formed from plastic, and magnet 67 that adheres to reference base 61 is attached to intermediate base 62. Accordingly, it becomes possible to reduce the weight of intermediate base 62, intermediate base 62 is adhered onto reference base 61 by magnet 67, and intermediate base 62 does not move, even by vibrations or the like, in the vertical direction in relation to reference base 61.

In the embodiment described above, large intermediate base 162 is attached, to be attachable and detachable, onto reference bases 61 across the multiple reference bases 61, and it becomes possible to position large intermediate base 162 using positioning pins 63. Accordingly, the nozzle stations NS that are several times larger than reference base 61 may be attached onto large intermediate base 162 which is attached to straddle the multiple reference bases 61.

In the embodiment described above, description is given of an example in which positioning pins 63 that serve as the positioning sections are provided on reference base 61, and positioning holes 65 that engage with positioning pins 63 are provided in intermediate base 62; however, positioning holes that serve as the positioning sections may be provided on the reference base 61 side, and positioning pins that engage with the positioning holes may be provided on intermediate base 62.

In the embodiment described above, description is given of an example in which the same type of suction nozzles N are held by the nozzle station NS; however, two or more types of nozzles N may be held by nozzle station NS in a mixed manner.

In the embodiment described above, description is given of an example in which positioning and fixing device 80 that positions and fixes nozzle station NS on intermediate base 62 to be attachable and detachable is configured to include engaging fitting 71 that forms engaging groove 71a, pushing fitting 72, engaging block 75 that forms inclined surface 75a, and engaging pin 76; however, positioning fixing device 80 may comparatively easily attach and detach the nozzle station NS onto intermediate base 62, and may accurately position and fix the nozzle station NS.

Although the present disclosure is described above according to the embodiment, the present disclosure is not limited to the configurations described in the above embodiment, and may adopt various aspects within a scope that does not depart from the gist of the present disclosure.

POTENTIAL INDUSTRIAL APPLICABILITY

The nozzle station installation device according to the present disclosure is suitable for use in a nozzle cleaning device that cleans suction nozzles that are used in an electronic component mounting machine.

REFERENCE SIGNS LIST

10 . . . electronic component mounting machine, 50 . . . nozzle cleaning device, 51 . . . nozzle station support section, 56 . . . camera, 61 . . . reference base, 62 (62A, 62B) . . . intermediate base, 63 . . . positioning section (positioning pin), 64 . . . seating detection sensor, S1 to S3 . . . switch, 80 . . . positioning and fixing device, 90 . . . 2D code, 162 . . . large intermediate base, N . . . suction nozzle, NS (NS1 to NS3) . . . nozzle station

The invention claimed is:

1. A nozzle station installation system comprising:
multiple nozzle stations that hold multiple suction nozzles that are used in an electronic component mounter;
multiple reference bases; and
an intermediate base provided on each of the multiple reference bases to be attachable and detachable and on which the multiple nozzle stations are respectively capable of being placed,
wherein positioning sections configured to position the intermediate base are provided on each of the multiple reference bases at common positions,
wherein a positioning and fixing device that positions and fixes the multiple nozzle stations to be attachable and detachable is provided on each of the multiple intermediate bases,
wherein a 2D code is disposed on each of the multiple nozzle stations in a fixed positional relationship with the positioning sections,
wherein a seating detection sensor that detects seating of the nozzle station placed on the intermediate base is provided on each of the multiple reference bases in a common position, and the seating detection sensor includes multiple switches and is capable of recognizing the nozzle station that is placed on the intermediate base based on an operation state of the multiple switches, and
wherein the nozzle station installation system includes at least two types of intermediate bases on which different types of the nozzle stations are placed, and in the nozzle stations that are placed on the two types of intermediate bases, the 2D code is disposed at positions which are different from each other.

2. The nozzle station installation system according to claim 1,
wherein the 2D code is disposed at a same position on nozzle stations of a same type.

3. The nozzle station installation system according to claim 2,
wherein a large-nozzle station that holds a large suction nozzle is provided which is different and separate from the multiple nozzle stations, the large-nozzle station being capable of being positioned directly on one of the multiple reference bases by the positioning sections without interposing the intermediate base, and a 2D code being disposed on the large-nozzle station in a fixed positional relationship with the positioning sections.

4. The nozzle station installation system according to claim 2,
wherein the intermediate base is formed from plastic, and a magnet that adheres to one of the multiple reference bases is attached to the intermediate base.

5. The nozzle station installation system according to claim 2,
wherein a large intermediate base is attached across the multiple reference bases to be attachable and detachable, and the large intermediate base is capable of being positioned by the positioning sections.

6. The nozzle station installation system according to claim 1,
wherein a large-nozzle station that holds a large suction nozzle is provided which is different and separate from the multiple nozzle stations, the large-nozzle station being capable of being positioned directly on one of the multiple reference bases by the positioning sections without interposing the intermediate base, and a 2D code being disposed on the large-nozzle station in a fixed positional relationship with the positioning sections.

7. The nozzle station installation system according to claim 1,
wherein the intermediate base is formed from plastic, and a magnet that adheres to one of the multiple reference bases is attached to the intermediate base.

8. The nozzle station installation system according to claim 1,
wherein a large intermediate base is attached across the multiple reference bases to be attachable and detachable, and the large intermediate base is capable of being positioned by the positioning sections.

\* \* \* \* \*